(12) United States Patent
Montgomery et al.

(10) Patent No.: US 10,826,010 B1
(45) Date of Patent: Nov. 3, 2020

(54) HIGH-EFFICIENCY QLED STRUCTURES

(71) Applicant: Sharp Kabushiki Kaisha, Osaka (JP)

(72) Inventors: David James Montgomery, Oxford (GB); Tim Michael Smeeton, Oxford (GB); Edward Andrew Boardman, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/446,677

(22) Filed: Jun. 20, 2019

(51) Int. Cl.
*H01L 51/50* (2006.01)
*H01L 51/52* (2006.01)
*H01L 27/32* (2006.01)

(52) U.S. Cl.
CPC ........ *H01L 51/502* (2013.01); *H01L 27/3211* (2013.01); *H01L 27/3244* (2013.01); *H01L 51/5271* (2013.01); *H01L 2251/5315* (2013.01)

(58) Field of Classification Search
CPC .............. H01L 51/504; H01L 27/3209; H01L 51/5012; H01L 51/5016; H01L 51/5206
See application file for complete search history.

(56) References Cited

U.S. PATENT DOCUMENTS

| | | | |
|---|---|---|---|
| 7,245,065 B2 | 7/2007 | Ghosh et al. | |
| 7,324,574 B2 | 1/2008 | Kim | |
| 7,728,512 B2 | 6/2010 | D'andrade | |
| 7,898,164 B2 | 3/2011 | Lee et al. | |
| 7,973,470 B2 | 7/2011 | Cok | |
| 8,471,268 B2 | 6/2013 | Moon et al. | |
| 8,894,243 B2 | 11/2014 | Cho et al. | |
| 9,219,250 B2 | 12/2015 | Jeong et al. | |
| 9,362,530 B2 | 6/2016 | Visser et al. | |
| 9,583,727 B2 | 2/2017 | Cho et al. | |
| 9,722,200 B2 | 8/2017 | Ma et al. | |
| 2006/0158098 A1 | 7/2006 | Raychaudhuri et al. | |
| 2010/0327263 A1 | 12/2010 | Lin et al. | |
| 2013/0009925 A1 | 1/2013 | Ueda et al. | |
| 2013/0099258 A1 | 4/2013 | Lim et al. | |

(Continued)

FOREIGN PATENT DOCUMENTS

| | | |
|---|---|---|
| WO | WO 2016144062 | 9/2016 |
| WO | WO 2017205174 | 11/2017 |

*Primary Examiner* — Changhyun Yi
(74) *Attorney, Agent, or Firm* — Renner, Otto, Boisselle & Sklar, LLP

(57) ABSTRACT

A light-emitting structure maximizes constructive interference for light emission by adjusting charge carrier mobilities of different sub-pixel emissive layers such that charge recombination occurs at a boundary of each emissive layer and one of the charge transport layers. The light-emitting layer structure includes two electrode layers that respectively generate first and second charges that are carried via first and second charge transport layers, and a plurality of emissive layers (EMLs) including a first EML having a first charge mobility favoring the first charges and a second EML having a second charge mobility favoring second charges. The first EML emits light by recombination of the first and second charges at a first boundary layer formed at one of the charge transport layers and the first EML, and the second EML emits light by recombination of the first and second charges at a second boundary layer formed at the other of the charge transport layers and the second EML.

17 Claims, 10 Drawing Sheets

(56) References Cited

U.S. PATENT DOCUMENTS

| | | | |
|---|---|---|---|
| 2014/0034927 A1* | 2/2014 | Seo | H01L 51/006 |
| | | | 257/40 |
| 2014/0131669 A1 | 5/2014 | Park | |
| 2014/0151651 A1 | 6/2014 | Jin et al. | |
| 2015/0060812 A1 | 3/2015 | Kim et al. | |
| 2015/0115236 A1 | 4/2015 | Chung et al. | |
| 2015/0340410 A1 | 11/2015 | Hack et al. | |
| 2016/0240820 A1 | 8/2016 | He et al. | |
| 2016/0315290 A1 | 10/2016 | Zhang et al. | |

* cited by examiner

HIGH-EFFICIENCY QLED STRUCTURES

TECHNICAL FIELD

The present invention relates to a layer structure used in emissive devices, and, particularly, quantum dot (QD) light emitting diodes (QLEDs). QLEDs incorporating the present invention are incorporated into displays to reduce complexity in the fabrication of the device while minimizing off-axis color shift and maximizing device efficiency.

BACKGROUND ART

Cavities are well known in semiconductor laser fabrication as described in U.S. Pat. No. 7,324,574 (Kim, issued Jan. 29, 2008). The use of cavities with organic LEDs (OLEDs) and QLEDs is also known as shown in US 2006/0158098 (Raychaudhuri et al., published Jul. 20, 2006), U.S. Pat. No. 9,583,727 (Cho et al., issued Feb. 28, 2017), and U.S. Pat. No. 8,471,268 (Moon et al., issued Jun. 25, 2013). Raychaudhuri et al. describe a top emitting OLED structure, and Cho et al. and Moon et al. describe QLED structures with light emitting regions between reflective areas, one of which is partially transmitting.

Typically, QLED pixels include a red sub-pixel, a green sub-pixel, and a blue sub-pixel. Due to the differing wavelengths of emission of the three sub-pixels, the cavities must, in general, be different in size and/or composition for the angular emission to be similar enough to minimize off-axis color shift. Having different sub-pixel structures increases device complexity and leads to significant costs for fabrication, and often compromises are made in efficiency to achieve acceptable results. Methods for reducing the complexity of fabricating sub-pixels of different sizes include US 2015/0340410 (Hack et al., published Mar. 26, 2019) which describes cavities with different optical path lengths within multiple sub-pixels.

Other modifications described in the prior art simply add complexity to the fabrication of a cavity structure in an LED by adding additional processing steps such as roughening or patterning. For example, US 2014/0151651 (Jin et al., published Jun. 5, 2014) describes roughening of the top electrode to enhance extraction, and U.S. Pat. No. 8,894,243 (Cho et al., issued Nov. 25, 2014) describes patterning of the base reflecting material. Further modifications described in the prior art add complexity by adding additional layers to the device. For example, U.S. Pat. No. 9,219,250 (Jeong et al., issued Dec. 22, 2015) describes a film with a striped layer with alternate high and low reflective index, and US 2013/0009925 (Ueda et al., published Jan. 10, 2013) describes tilted emissive layers with prism layers outside the cavity.

SUMMARY OF INVENTION

There is a need in the art, therefore, for increased efficiency and improved brightness for light emitting structures. The present invention provides a specific arrangement for an emissive display pixel using a quantum dot (QD) electroluminescent material in an LED arrangement. This arrangement typically includes multiple sub-pixels, each of which emits light of a different color or wavelength, and each includes a layer of a QD emission material disposed between an electron transport layer (ETL) and a hole transport layer (HTL). This sub-pixel stack is then disposed between two conducting electrode layers, one side of which is formed on a glass substrate. The conducting layers may reflect light emitted by the QD emission material to form an optical cavity. Embodiments of the present application may be implemented in "top" emitting (TE) structures in which the emission is from the side opposite of the glass substrate. Embodiments of the present application also are applicable to "inverted" structures for which the layer sequence is substrate/cathode/ETL/QD emissive layer/HTL/anode.

Generally, a different structure for an optical cavity is required for different colors of light emission. To maximize constructive interference, the round-trip path for light reflected in the optical cavity should correspond to a phase shift of $2n\pi$, where n is an integer. The round-trip path for light in the optical cavity is from a top reflector, i.e., a first conducting electrode layer of the two conducting electrode layers, to the bottom reflector, i.e., a second conducting electrode layer of the two conducting electrode layers, and back to the top reflector.

To form an LED that maximizes constructive interference, the present invention uses a layer structure in which the layer thicknesses of the charge transport layers and the electrode layers is the same for each sub-pixel. To emit light that generates the maximum constructive interference in the cavity, the present invention varies the emission layer thickness, concentrates light emitted at an emissive layer boundary surface, i.e., the HTL or ETL, and varies the emissive layer boundary surface from which light is emitted between sub-pixels. For example, a sub-pixel configured to emit a longer wavelength, e.g., red light, may have a thicker emissive layer with emission concentrated at a lower, HTL, side of the emissive layer to excite the second order mode (n=2) at the lower maximum of the mode (approximately ¼ of the cavity thickness away from a lower reflector). A second sub-pixel configured to emit green light may have a thinner emissive layer with emission concentrated at a lower, HTL, side of the emissive layer to excite the second order mode (n=2) corresponding for a green wavelength. A third sub-pixel configured to emit blue light may have a thicker emissive layer corresponding to a third order mode (n=3) and emission concentrated at a higher, ETL, side of the emissive layer corresponding to the third order mode.

An aspect of the invention, therefore, is a light-emitting structure that maximizes constructive interference for light emission by adjusting charge carrier mobilities of different sub-pixel emissive layers such that charge recombination occurs at a boundary of each emissive layer and one of the charge transport layers. In exemplary embodiments, the light-emitting layer structure includes a substrate; a first electrode layer deposited on the substrate that generates first charges; a first charge transport layer deposited on the first electrode layer that transports the first charges; a plurality of emissive layers (EMLs) deposited on the first charge transport layer including at least a first EML having a first charge mobility favoring the first charges and a second EML having a second charge mobility favoring second charges; a second charge transport layer deposited on the first EML and the second EML that transports the second charges; and a second electrode layer deposited on the second charge transport layer that generates the second charges that are transported by the second charge transport layer. The first EML is configured to emit light by recombination of the first and second charges at a first boundary layer formed by one of the first or second charge transport layers and the first EML, and the second EML is configured to emit light by a recombination of the first and second charges at a second boundary layer formed by the second EML and one of the first or second charge transport layers.

In exemplary embodiments, the first EML has a first thickness and the second EML has a second thickness different from the first thickness, depending upon a wavelength of light to be emitted from each of the first and second EMLs. In addition, the first boundary layer may correspond to a standing wave maximum of a wavelength of light emitted by the first EML, and the second boundary layer may correspond to a standing wave maximum of a wavelength of light emitted by the second EML. The first and second boundary layers may be boundaries with different charge transport layers. The different emissive layers may correspond to different colored sub-pixels, and red, green, and blue sub-pixels may be combined to form a white pixel.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF EMBODIMENTS

Figure 1:
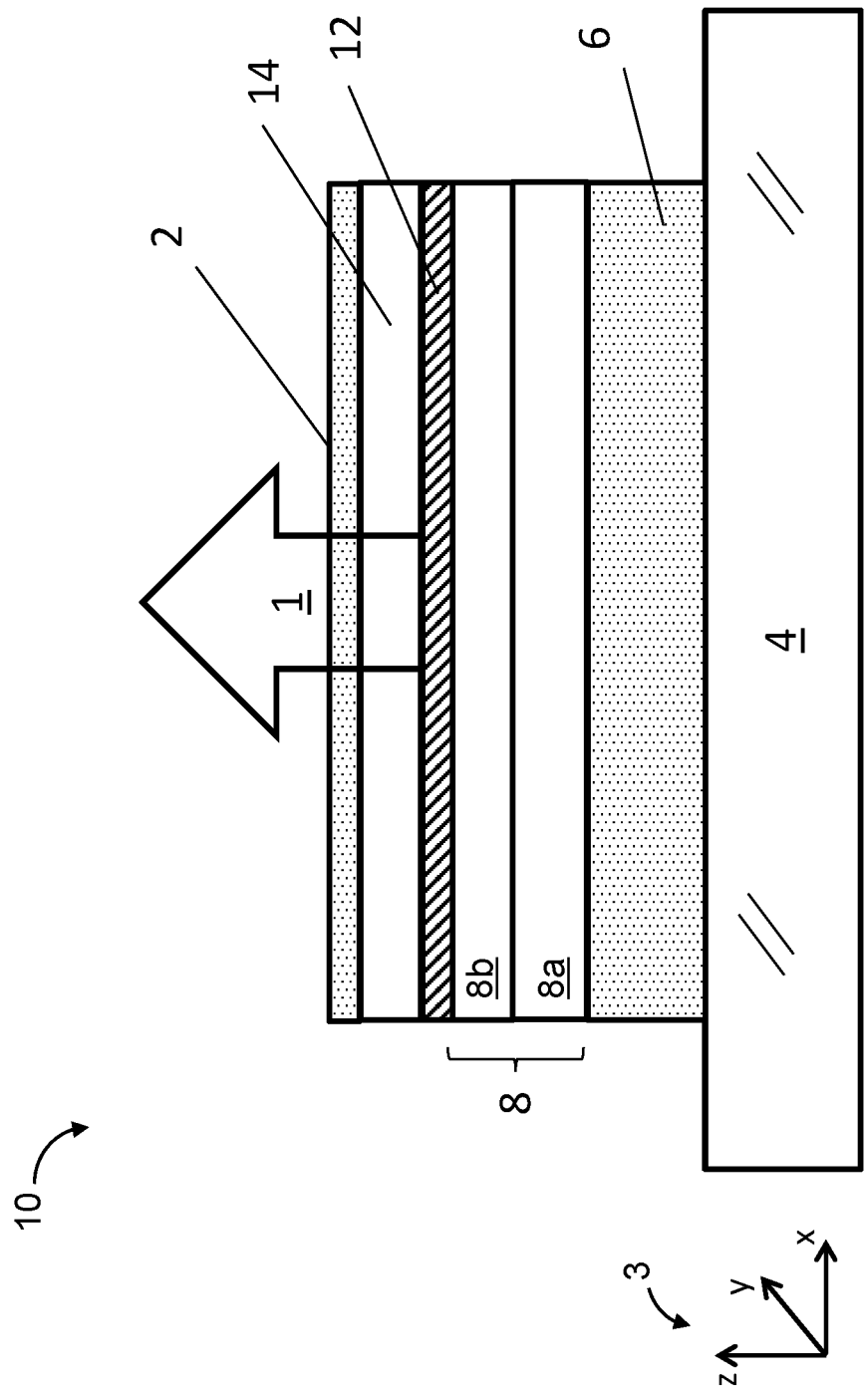
FIG. 1 is a drawing depicting an exemplary top emitting light-emitting device structure.

Embodiments of the present invention will now be described with reference to the drawings, wherein like reference numerals are used to refer to like elements throughout. It will be understood that the figures are not necessarily to scale.

FIG. 1 is a drawing depicting an exemplary top emitting (TE) light-emitting device structure 10. The TE structure 10 emits light 1 through a top conducting layer, a top electrode 2, that is a partial reflector formed opposite from a substrate 4. The substrate 4 may be a glass substrate on which a bottom conducting layer, a bottom electrode 6, is formed. The thickness of the bottom electrode 6 may be greater than 80 nm. The bottom electrode 6 may be a metallic material configured to reflect emitted light. The bottom electrode 6 is typically aluminum, silver, Indium Tin Oxide (ITO), and the like or a combination thereof. A hole transport layer (HTL) 8 may be formed on the bottom electrode 6. The HTL 8 may include two layers, a first HTL sub-layer 8a formed using a material such as PEDOT:PSS (poly(3,4-ethylenedioxythiophene) polystyrene sulfonate) and a second HTL sub-layer 8b formed using a material characterized by a high hole mobility such as TFB [poly(9,9'-dioctylfluorene-co-bis-N, N'-(4-butylphenyl)diphenylamine)]. An emissive layer (EML) 12 may be formed on the HTL 8. The EML 12 may include nanoparticles such as quantum dots and the like. An electron transport layer (ETL) 14 may be formed on the EML 12. The ETL 14 may be formed using a material characterized by electron mobility such as nanoparticle zinc oxide. The top electrode 2 is a thin metal layer such as silver, magnesium-silver alloy, and the like. The top electrode 2 may be thick enough to carry sufficient current but thin enough to be transparent to the light emission. FIG. 1 also shows an xyz-coordinate system 3 that will be used throughout the description.

The configuration of FIG. 1 may be referred to in the art as a "normal structure", with the bottom electrode 6 closest to the substrate constituting the anode, and the top electrode 2 farthest from the substrate constituting the cathode. An alternative configuration is referred to in the art as an "inverted structure", in which the bottom electrode 6 closest to substrate constitutes the cathode and the electrode layer 2 farthest from the substrate constitutes the anode. In an inverted structure, the charge transport layer 8 is the ETL and the charge transport layer 14 is HTL. Accordingly, the ETL and HTL may be referred to herein generally as charge transport layers (CTL) as appropriate.

Figure 2:
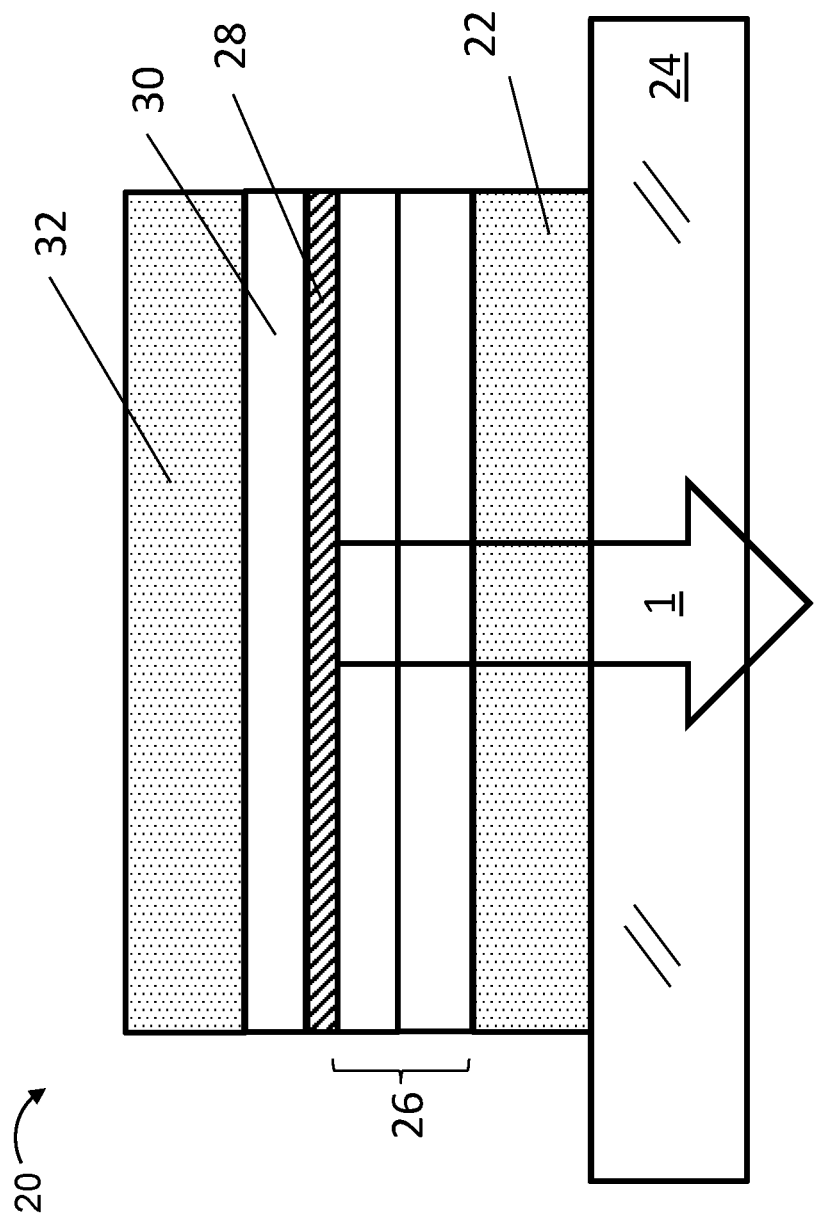
FIG. 2 is a drawing depicting an exemplary bottom emitting light-emitting device structure.

FIG. 2 is a drawing depicting an exemplary bottom emitting (BE) light-emitting device structure 20. The BE structure 20 emits light 1 through a bottom electrode 22 and a transparent substrate 24. The BE structure 20 includes an HTL 26, an emissive layer (EML) 28, and an ETL 30 that are similar to or composed comparably as the layers formed in the TE structure 10. The BE structure 20 includes a top electrode 32 that may be a thick opaque metal configured to reflect light emitted from the emissive layer. The bottom electrode 22 may be a partial reflector such as Indium Tin Oxide (ITO). The use of a partial reflector such as ITO that is substantially more transmissive than thin metal layers facilitates the fabrication of thicker electrodes to serve as the bottom electrode 22. The example of FIG. 2 also is depicted as a normal structure, although a BE device also may be configured as an inverted structure as described above with respect to FIG. 1.

The present invention can apply equally to top and bottom emitting structures as the formation of the electrodes does not impact operations as related to the principles of the present application. The following description generally is in connection with top emitting structures, but embodiments of the present invention described herein may also be used in bottom emitting structures.

Figure 3:
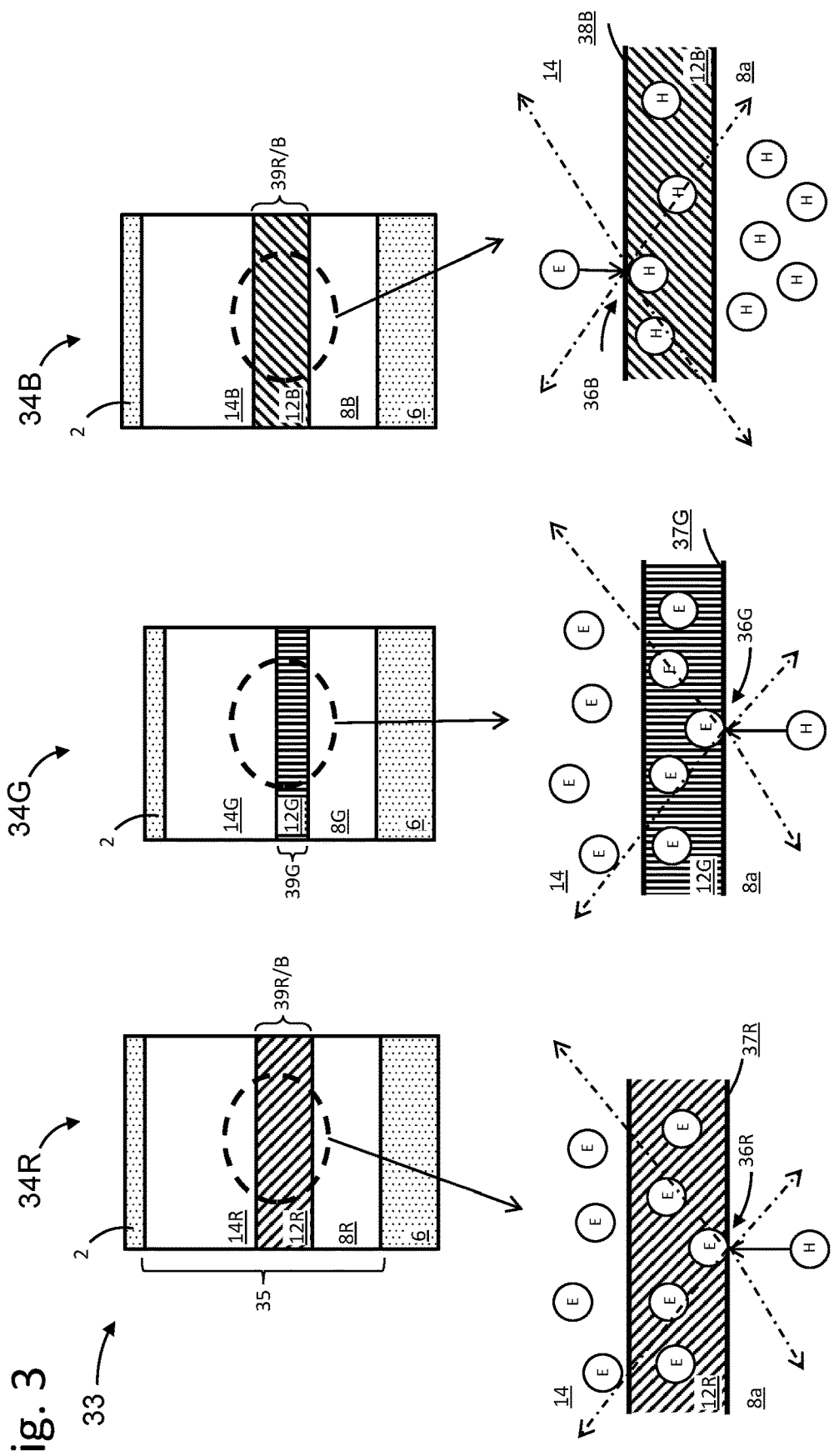
FIG. 3 is a drawing depicting a white display pixel including three sub-pixels in accordance with embodiments of the present invention.

FIG. 3 is a drawing depicting a white display pixel including three sub-pixels in accordance with embodiments of the present invention. A display pixel may include two or more sub-pixels each of which emits light of a different color. An exemplary white display pixel 33 includes three sub-pixels, a red sub-pixel 34R, a green sub-pixel 34G, and a blue sub-pixel 34B. The thickness of the sub-pixels is on the order of 100-200 nm. The display pixel 33 has layers that are comparable as in the conventional configurations of FIGS. 1 and 2, and thus like layers are identified with like reference numerals. As to each sub-pixel, an overall structural view is shown, along with a close-up view of the EML layer as indicated by the oval indicators in the figure.

An optical cavity 35 is formed by the top electrode 2 and the bottom electrode 6 in each sub-pixel. The optical cavity provides an arrangement that reflects light back and forth between the electrodes to cause interference with light in the optical cavity 35. At particular angles, the interference is constructive. To increase device efficiency, the round-trip top reflector to top reflector angle that light travels should be 2nπ, n being an integer and is referred to as the "mode" of the cavity. Constructive interference, and therefore light emission, is strong in optical cavities formed to reflect light at 2nπ.

Conventional design processes alter the layers in the cavity so that the constructive interference happens for light propagating normal to the layers. As the interference is highly wavelength dependent, conventional approaches use a different structure for each sub-pixel of different color light emission to meet these criteria. Thus, different layer thicknesses conventionally are required for red, green, and blue wavelengths, which may be difficult to individually fabricate. The present invention describes structures and methods that facilitate QLED structures patterned with layers several of which have equal thickness between sub-pixels, in particular the layers other than the emissive layers, so as to reduce complexity as compared to conventional configurations.

In particular, the present invention provides a structure in which the thickness of the top electrode 2, the bottom electrode 6, the ETL 14, and the HTL 8 are the same in each sub-pixel of different wavelength emission. To form a sub-pixel with an optical cavity 35 that maximizes the emission of the respective wavelength, the EML 12 in at least one sub-pixel has a different thickness. To further optimize the path that the emitted light travels in the optical cavity 35, the light from each the EML 12 in each sub-pixel is concentrated at a specific boundary surface adjacent to a charge transport layer, i.e., the ETL 14 or the HTL 8.

For example, the green sub-pixel 34G has an EML 12G with a thickness 39G that is less than a thickness 39R/B of the red EML 12R and the blue EML 12B (in other words, in this example thicknesses of the EMLs of the red and blue sub-pixels are equal). Furthermore, the concentration of emission at a boundary surface of the EML 12 is illustrated in the close-up view of the EML 12 of each sub-pixel 34. Electron-hole recombination 36R in the red sub-pixel 34R occurs close to the HTL boundary 37R. Electron-hole recombination 36G in the green sub-pixel 34G comparably occurs close to the HTL boundary 37G. In contrast, electron-hole recombination 36B in the blue sub-pixel 34B occurs close to the ETL boundary 38B.

To enable electron-hole recombination at the ETL boundary 38B in the blue sub-pixel 34B, an EML 12B in which the hole mobility is higher than the electron mobility may be used so that holes move readily through the EML to the ETL boundary 38B. In combination, or on its own, the HTL 8B may be formed with a higher hole mobility than the electron mobility of the ETL 14B further to enhance electron-hole recombination at the ETL boundary 38B. The mobility is related to material properties of each layer. In exemplary embodiments, the ETL 14 may be formed with zinc oxide as the electron transporting material and have an electron mobility in the range $10^{-4}$ $cm^2 \cdot V^{-1} \cdot s^{-1}$ to $10^{-3}$ $cm^2 \cdot V^{-1} \cdot s^{-1}$. To encourage recombination on the ETL boundary 38, TFB may be used as the hole transporting material in the HTL 8, giving the HTL 8 a hole mobility in the range $10^{-3}$ $cm^2 \cdot V^{-1} \cdot s^{-1}$ to $10^{-2}$ $cm^2 \cdot V^{-1} \cdot s^{-1}$ (i.e. higher than the electron mobility of the ETL 14).

To enable electron-hole recombination 36R at the HTL boundary 37R in the red sub-pixel 34R, an EML 12R in which the electron mobility is higher than the hole mobility may be used so that electrons move readily through the EML to the HTL boundary 37R. In combination, or on its own, the ETL 14R may be formed with a higher electron mobility than the hole mobility of the HTL 8R further to enhance electron-hole recombination at the HTL boundary 37R. Similarly, to enable electron-hole recombination 36G at the HTL boundary 37G in the green sub-pixel 34G, an EML 12G in which the electron mobility is higher than the hole mobility may be used so that electrons move readily through the EML to the HTL boundary 37G. In combination, or on its own, the ETL 14G may be formed with a higher electron mobility than the hole mobility of the HTL 8G further to enhance electron-hole recombination at the HTL boundary 37G. To encourage recombination on the HTL boundary 37R or 37G, the ETL 14 may be formed with zinc oxide as the electron transporting material and have an electron mobility in the range $10^{-4}$ $cm^2 \cdot V^{-1} \cdot s^{-1}$ to $10^{-3}$ $cm^2 \cdot V^{-1} \cdot s^{-1}$. PVK (Poly(9-vinylcarbazole)) may be used as the hole transporting material, giving the HTL 8 a hole mobility in the range $10^{-6}$ $cm^2 \cdot V^{-1} \cdot s^{-1}$ to $10^{-5}$ $cm^2 \cdot V^{-1} \cdot s^{-1}$ (i.e. lower than the electron mobility of the ETL 14).

Accordingly, the EML/CTL boundary layer of the electron/hole recombination 36 may be controlled by material selection that dictates the relative electron and hole mobilities through the quantum dot EML 12 as to each sub-pixel. Forming an EML 12 with electron mobility greater than the hole mobility promotes recombination 36 at the interface or boundary layer between the EML 12 and the HTL 8 (e.g., red and green sub-pixels) because electrons are more easily able to pass through the EML quantum dot layer. Conversely, an EML with a higher hole mobility than electron mobility promotes recombination at the interface or boundary layer between the EML 12 and the ETL 14 (e.g., blue sub-pixel) because holes are more easily able to pass through the EML quantum dot layer.

The difference in carrier mobility may be achieved by choice of ligand which passivates the surface of the quantum dots. For example, thiol (e.g. 1-octanethiol, 1-dodecanethiol) and amine (e.g. oleylamine) ligands typically produce an EML 12R or 12G that has a higher electron mobility than hole mobility, and therefore encourage recombination 36R/36G at the interface or boundary layer between the EML 12R/12G and the HTL 8R/8G. Carboxylic acid ligands (e.g. oleic acid, thiophene-2,5-dicarboxlic acid) typically produce an EML 12B with a higher hole mobility, encouraging recombination at the interface or boundary layer between the EML 12B and the ETL 14B.

The ligands may be exchanged in a solution phase prior to manufacturing the emissive display pixel 33. The ligands may be exchanged in the solid phase by using a ligand exchange process after the EML 12 has been disposed but before further layers are disposed.

Figure 4A:
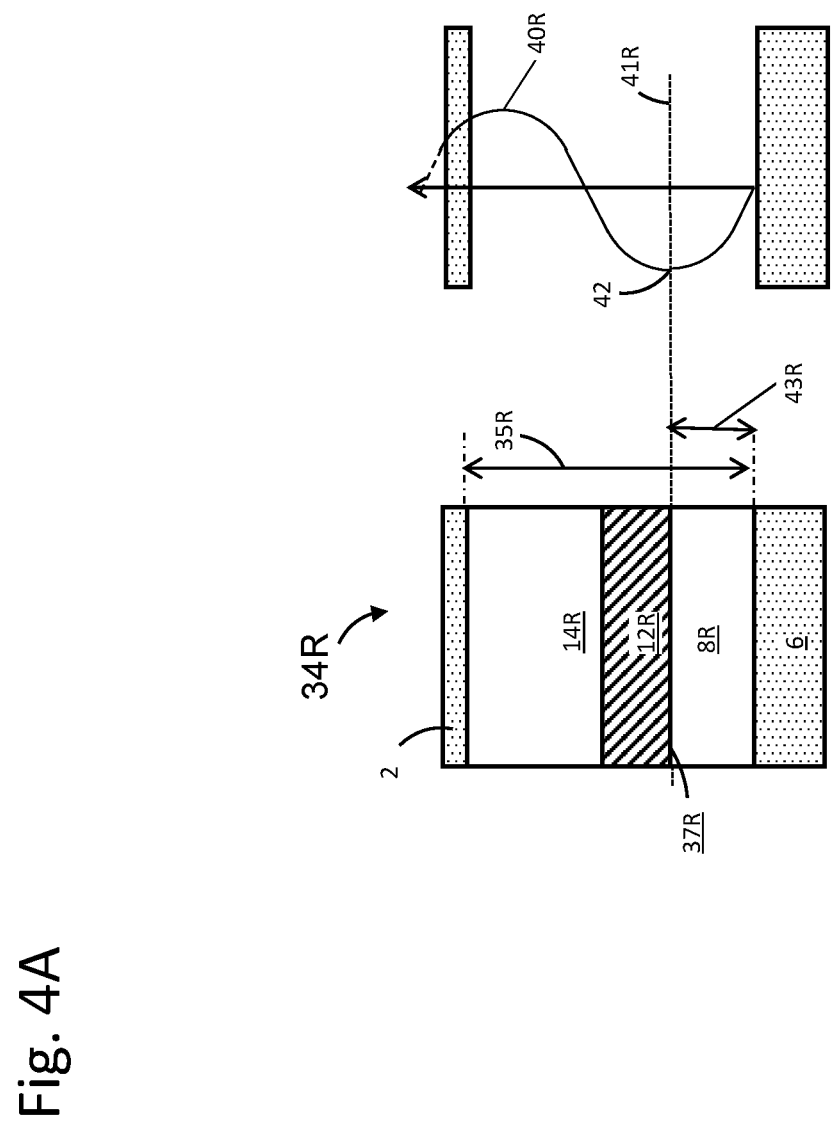
FIGS. 4A, 4B, and 4C are drawings depicting constructive interference in sub-pixels in accordance with embodiments of the present invention.
Figure 4B:
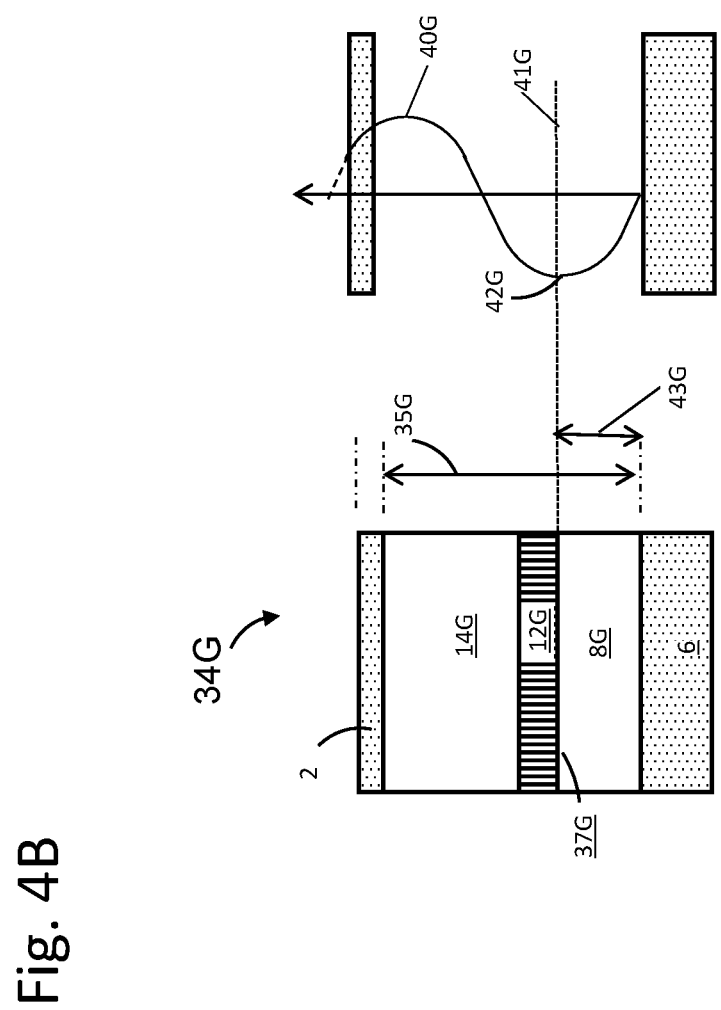
Figure 4C:
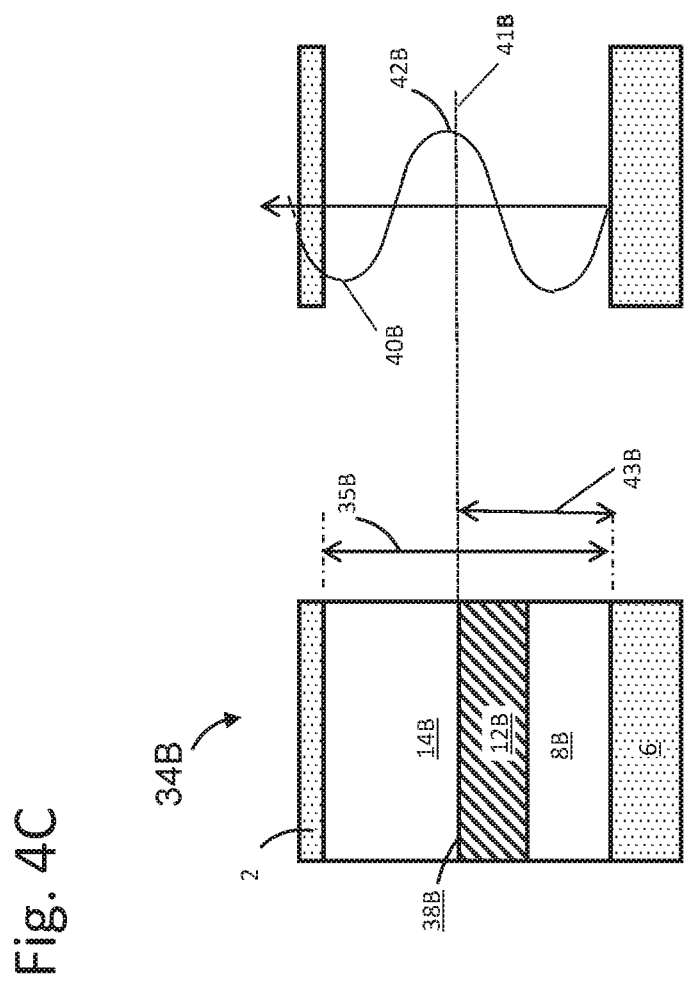

FIGS. 4A, 4B, and 4C are drawings depicting constructive interference in sub-pixels in accordance with embodiments of the present invention. FIG. 4A depicts the approximate maximum electric field density 40R in the red sub-pixel 34R. Because red light corresponds to emissions with a longer wavelength, the red sub-pixel 34R has a thicker EML 12R relative to the thickness of the EML 12G of the shorter wavelength green sub-pixel 34G (FIG. 4B). The thickness of the cavity 35R is, approximately, nλ/2 where λ is the wavelength associated with red light. The sub-pixel may be configured to correct for a phase shift associated with the metal electrode boundaries. For a second order mode, n=2, the cavity may be approximately λ in size and a standing wave pattern of one wavelength is excited. To form a standing wave pattern in the optical cavity, an emission plane 41R must be at one of the standing wave maxima. If the emission plane 41R is not at a standing wave maximum, the mode is not excited and the emission is trapped and hence lost.

As shown in FIG. 4A, therefore, the emission plane 41R in EML 12R is at the HTL boundary 37R at which more recombination occurs as illustrated in FIG. 3 for the red sub-pixel 34R. At this position, emission excites the second order mode (n=2) at a lower maximum of the wave 42R. The emission at the HTL boundary 37R is approximately one-fourth thickness 43R of the total cavity thickness 35R away from the lower reflector, i.e., lower electrode 6 closest to the substrate. The top reflector, i.e., the top electrode 2 farthest from the substrate, is semi-transparent and thus the field at this point is not nodal. Accordingly, the cavity thickness may not be precisely $n\lambda/2$. A constant phase shift is applied to the wave 40R on reflection at the top electrode 2 independent of cavity thickness. The cavity design may be modified to account for this phase shift.

FIG. 4B depicts the approximate maximum electric field density 40G in the green sub-pixel 34G. Because green light corresponds to emissions with a smaller wavelength than the red sub-pixel 34R, the green sub-pixel has a thinner EML 12G relative to the longer wavelength red sub-pixel 34R. The thinner EML 12G maintains the thickness of the cavity 35G at, approximately, $n\lambda/2$ where $\lambda$ is the wavelength associated with green light. The sub-pixel may be configured to correct for a phase shift associated with the metal electrode boundaries. For a second order mode, n=2, the cavity may be approximately $\lambda$ in size and a standing wave pattern of one wavelength is excited. To form a standing wave pattern in the optical cavity, an emission plane 41G must be at one of the standing wave maxima. If the emission plane 41G is not at a standing wave maximum, the mode is not excited and the emission is trapped and hence lost.

As shown in FIG. 4B, therefore, the emission plane 41G in EML 12G is at the HTL boundary 37G at which more recombination occurs as illustrated in FIG. 3 for the green sub-pixel 34G. This is similar to the emission plane for the red sub-pixel 34R as described above. At this position, emission excites the second order mode (n=2) at a lower maximum of the wave 42G. The emission at the HTL boundary 37G is approximately one-fourth thickness 43G of the total cavity thickness 35G away from the lower reflector, i.e., lower electrode 6 closest to the substrate. The top reflector, i.e., the top electrode 2 farthest from the substrate, is semi-transparent and thus the field at this point is not nodal. Accordingly, the cavity thickness may not be precisely $n\lambda/2$. A constant phase shift is applied to the wave 40G on reflection at the top electrode independent of cavity thickness. The cavity design may be modified to account for this phase shift.

FIG. 4C depicts the approximate maximum electric field density 40B in the blue sub-pixel 34B. Because blue light corresponds to emissions with a shorter wavelength than the red sub-pixel 34R and the green sub-pixel 34G, the blue sub-pixel has a thicker EML 12B relative to the thickness of the EML 12G of the green sub-pixel 34G. The blue sub-pixel EML 12B may be the same thickness as the EML 12R of the red sub-pixel 34R for the following reasons. Because blue light is associated with a shorter wavelength, the blue sub-pixel may operate in a third order mode, n=3. For the third order mode, n=3, the cavity may be approximately $3\lambda/2$ in size and a standing wave pattern of approximately $3\lambda/2$ wavelengths are excited. The sub-pixel may be configured to correct for a phase shift associated with the metal electrode boundaries. To form a standing wave pattern in the optical cavity, an emission plane 41B must be at one of the standing wave maxima. If the emission plane 41B is not at a standing wave maximum, the mode is not excited and the emission is trapped and hence lost.

As shown in FIG. 4C, the emission plane 41B in EML 12B is at the ETL boundary 38B at which more recombination occurs as illustrated in FIG. 3 for the blue sub-pixel 34B. The n=3 mode for the blue sub-pixel 34B has a thickness similar to the n=2 mode for the red sub-pixel 34R. At this position, emission excites the third order mode (n=3) at a central maximum of the wave 42B. The emission at the ETL boundary 38B is approximately one-half thickness 43B of the total cavity thickness 35B away from the lower reflector, i.e., lower electrode 6 closest to the substrate. The top reflector, i.e., the top electrode 2 farthest from the substrate, is semi-transparent and thus the field at this point is not nodal. Accordingly, the cavity thickness may not be precisely $n\lambda/2$. A constant phase shift is applied to the wave 40G on reflection at the top electrode independent of cavity thickness. The cavity design may be modified to account for this phase shift.

Figure 5:
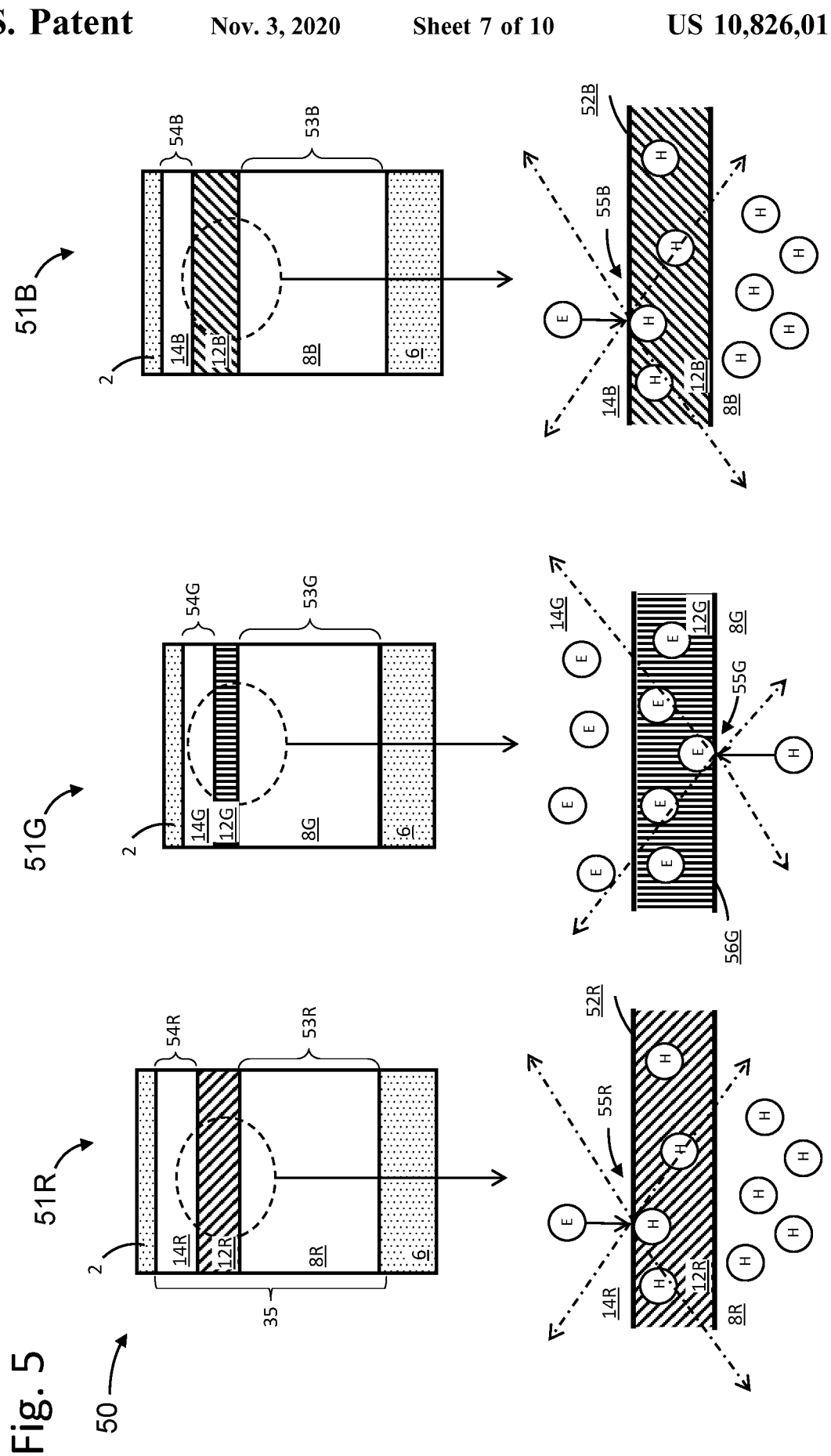
FIG. 5 is a drawing depicting a white display pixel including three sub-pixels in accordance with embodiments of the present invention.

FIG. 5 is a drawing depicting a white display pixel including three sub-pixels in accordance with embodiments of the present invention. An exemplary white display pixel 50 includes three sub-pixels including a red sub-pixel 51R, a green sub-pixel 51G, and a blue sub-pixel 51B. The thickness of the sub-pixels is on the order of 100-200 nm. The display pixel 50 has layers that are comparable as in the conventional configurations of FIGS. 1 and 2 and the embodiment of FIG. 3, and thus like layers of varying thickness are identified with like reference numerals.

In FIG. 5, similarly as in the embodiment of FIG. 3, the thickness of the top electrode 2, the bottom electrode 6, the ETL 14, and the HTL 8 are approximately the same in each sub-pixel. The optical cavity 35 formed by the top electrode 2 and the bottom electrode 6 may be similar to the optical cavity of the pixel described in FIGS. 3 and 4. The white display pixel 50 differs in that the red sub-pixel 51R and the blue sub-pixel 51B are configured to have more recombination for emission on the ETL side 52R, 52B of the respective EML, and the green sub-pixel 51G is configured to have emission on the HTL side 56G of the EML 12G.

To enable electron-hole recombination 55R, 55B at the ETL boundaries 52R, 52B in the red sub-pixel 51R and blue sub-pixel 51B, an EML 12R, 12B in which the hole mobility is higher than the electron mobility may be used so that holes move readily through the EML to the ETL boundary 52R and 52B. In combination, or on its own, the HTLs 8R, 8B may be formed with a higher hole mobility than the electron mobility of the ETLs 14R, 14B further to enhance electron-hole recombination at the ETL boundaries 52R, 52B. The mobility is related to material properties of each layer. In exemplary embodiments, the ETLs 14R, 14B may be formed with zinc oxide as the electron transporting material and have an electron mobility in the range $10^{-4}$ $cm^2 \cdot V^{-1} \cdot s^{-1}$ to $10^{-3}$ $cm^2 \cdot V^{-1} \cdot s^{-1}$. To encourage recombination on the ETL boundaries 52R, 52B, TFB may be used as the hole transporting material in the HTLs 8R, 9B, giving the HTLs a hole mobility in the range $10^{-3}$ $cm^2 \cdot V^{-1} \cdot s^{-1}$ to $10^{-2}$ $cm^2 \cdot V^{-1} \cdot s^{-1}$ (i.e. higher than the electron mobility of the ETL 14).

To enable electron-hole recombination 55G at the HTL boundary 56G in the green sub-pixel 51G, an EML 12G in which the electron mobility is higher than the hole mobility may be used so that electrons move readily through the EML to the HTL boundary 56G. In combination, or on its own, the ETL 14G may be formed with a higher electron mobility than the hole mobility of the HTL 8G further to enhance recombination on the HTL boundary 56G. The ETL 14G may be formed with zinc oxide as the electron transporting material and have an electron mobility in the range $10^{-4}$ $cm^2 \cdot V^{-1} \cdot s^{-1}$ to $10^{-3}$ $cm^2 \cdot V^{-1} \cdot s^{-1}$. PVK (Poly(9-vinylcarbazole)) may be used as the hole transporting material, giving the HTL 8G a hole mobility in the range $10^{-6}$ $cm^2 \cdot V^{-1} \cdot s^{-1}$ to $10^{-5}$ $cm^2 \cdot V^{-1} \cdot s^{-1}$ (i.e. lower than the electron mobility of the ETL 14).

Accordingly, similarly as in the previous embodiment, the EML/CTL boundary layer of the electron/hole recombination 55 may be controlled by material selection that dictates the relative electron and hole mobilities through the quantum dot EML 12 as to each sub-pixel. Forming an EML 12 with electron mobility greater than the hole mobility promotes recombination 55 at the interface or boundary layer between the EML 12 and the HTL 8 (e.g., green sub-pixel in this embodiment) because electrons are more easily able to pass through the EML quantum dot layer. Conversely, an EML with a higher hole mobility than electron mobility promotes recombination at the interface or boundary layer between the EML 12 and the ETL 14 (e.g., red and blue sub-pixels in this embodiment) because holes are more easily able to pass through the EML quantum dot layer.

Figure 6A:
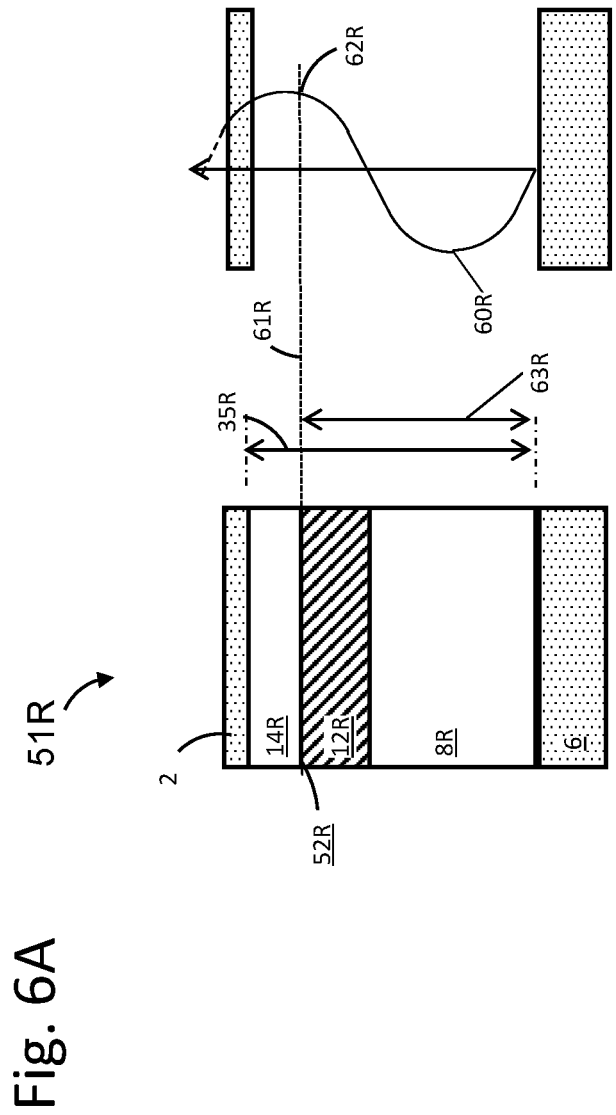
FIGS. 6A, 6B, and 6C are drawings depicting constructive interference in sub-pixels in accordance with embodiments of the present invention.
Figure 6B:
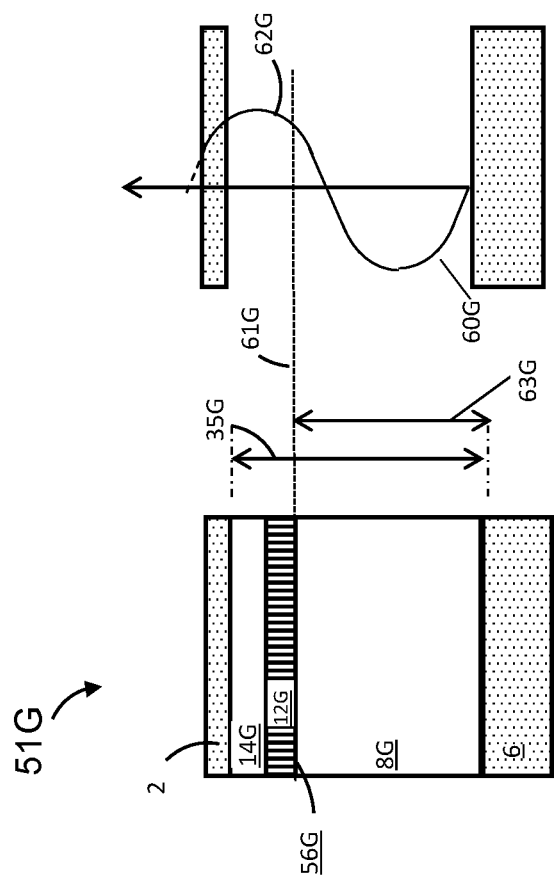
Figure 6C:
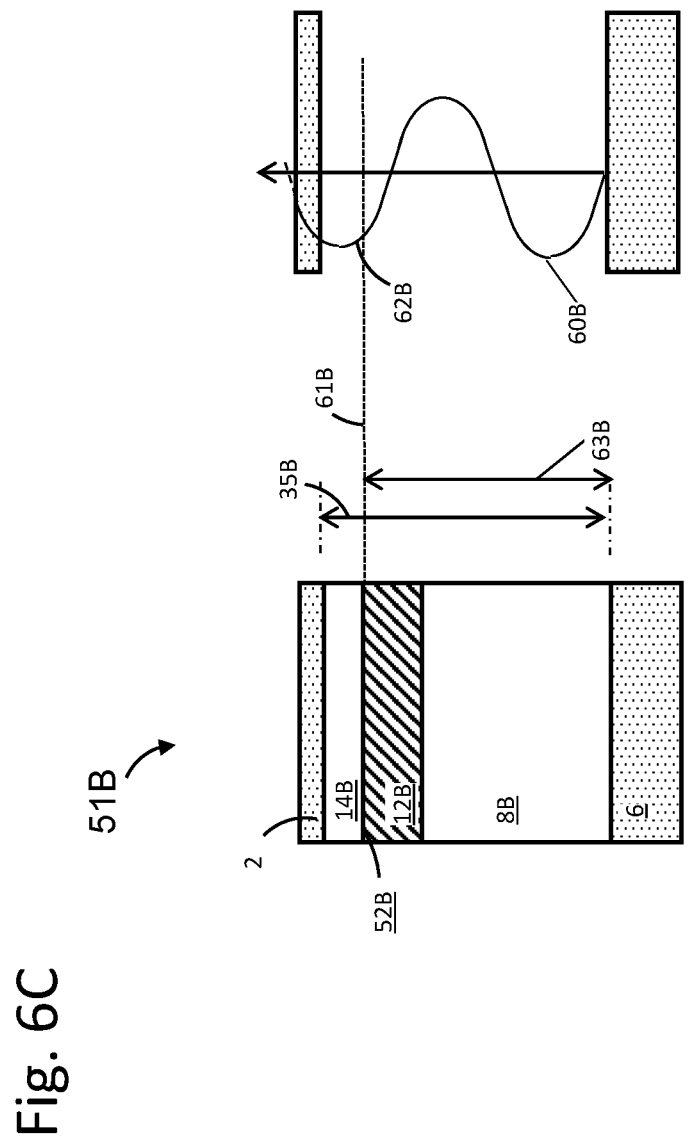

FIGS. 6A, 6B, and 6C are drawings depicting constructive interference in sub-pixels in accordance with embodiments of the present invention. In the white display pixel 50, the n=2 mode is excited in the red sub-pixel 51R and the green sub-pixel 51G and the blue sub-pixel 51B is excited in the n=3 mode, as in the previous example, but the HTL layer thicknesses 53 are larger and the ETL thicknesses 54 are lower. The different layer thicknesses enable the upper maximum in the mode pattern to be excited in each case. As the top electrode farthest from the substrate is semi-transparent, the electric field is non-zero (not nodal) at the electrode. Hence the cavity height is generally less than $n\lambda/2$ and the maximum is closer to the top electrode.

FIG. 6A depicts the approximate maximum electric field density 60R in the red sub-pixel 51R. The emission plane 61R in EML 12R is at the ETL boundary 52R at which more recombination occurs as illustrated in FIG. 5 for the red sub-pixel 51R. At this position, emission excites the second order mode (n=2) at an upper maximum of the wave 62R. The emission at the ETL boundary 52R is approximately three-fourths thickness 63R of the total cavity thickness 35R away from the lower reflector, i.e., lower electrode 6 closest to the substrate. The top reflector, i.e., the top electrode 2 farther from the substrate, is semi-transparent and thus the field at this point is not nodal. Accordingly, the cavity thickness may not be precisely $n\lambda/2$. A constant phase shift is applied to the wave 60R on reflection at the top electrode 2 independent of cavity thickness. The cavity design may be modified to account for this phase shift.

FIG. 6B depicts the approximate maximum electric field density 60G in the green sub-pixel 51G. As in the previous embodiment, the green sub-pixel has a thinner EML 12G relative to the longer wavelength red sub-pixel 51R. The thinner EML 12G maintains the thickness of the cavity 35G at, approximately, $n\lambda/2$ where $\lambda$ is the wavelength associated with green light. The sub-pixel may be configured to correct for a phase shift associated with the metal electrode boundaries. For a second order mode, n=2, the cavity may be approximately $\lambda$ in size and a standing wave pattern of one wavelength is excited. To form a standing wave pattern in the optical cavity, an emission plane 61G must be at one of the standing wave maxima. If the emission plane 61G is not at a standing wave maximum, the mode is not excited and the emission is trapped and hence lost. The emission plane 61G in EML 12G is at the HTL boundary 56G at which more recombination occurs as illustrated in FIG. 5 for the green sub-pixel 51G. At this position, emission excites the second order mode (n=2) near an upper maximum of the wave 62G. The emission at the HTL boundary 56G is approximately three-fourths thickness 63G of the total cavity thickness 35G away from the lower reflector, i.e., lower electrode 6 closest to the substrate. The top reflector, i.e., the top electrode 2 farthest from the substrate, is semi-transparent and thus the field at this point is not nodal. Accordingly, the cavity thickness may not be precisely $n\lambda/2$. A constant phase shift is applied to the wave 40G on reflection at the top electrode 2 independent of cavity thickness. The cavity design may be modified to account for this phase shift.

FIG. 6C depicts the approximate maximum electric field density 60B in the blue sub-pixel 51B. As in the previous example, the blue sub-pixel 51B has a thicker EML 12B relative to the EML thickness of the green sub-pixel 51G. The blue sub-pixel EML 12B may be the same thickness as the red sub-pixel EML 12R. Because blue light is associated with a shorter wavelength, the blue sub-pixel may operate in a third order mode, n=3. For the third order mode, n=3, the cavity may be approximately $3\lambda/2$ in size and a standing wave pattern of approximately $3\lambda/2$ wavelengths are excited. The sub-pixel may be configured to correct for a phase shift associated with the metal electrode boundaries. To form a standing wave pattern in the optical cavity, an emission plane 61B must be at one of the standing wave maxima. If the emission plane 61B is not at a standing wave maximum, the mode is not excited and the emission is trapped and hence lost.

As shown in FIG. 6C, the emission plane 61B in EML 12B is at the ETL boundary 68B at which more recombination occurs as illustrated in FIG. 5 for the blue sub-pixel 51B. The n=3 mode for blue light emission has a thickness similar to the n=2 mode for red light emission. At this position, emission excites the third order mode (n=3) at an upper maximum of the wave 62B. The emission at the ETL boundary 52B is approximately five-sixths thickness 63B of the total cavity thickness 35B away from the lower reflector, i.e., lower electrode 6 closest to the substrate. The top reflector, i.e., the top electrode 2 farthest from the substrate, is semi-transparent and thus the field at this point is not nodal. Accordingly, the cavity thickness may not be precisely $n\lambda/2$. A constant phase shift is applied to the wave 40G on reflection at the top electrode independent of cavity thickness. The cavity design may be modified to account for this phase shift.

While embodiments described herein largely have been described using a top emitting "normal structure", one of ordinary skill in the art would recognize many variations, modifications, and alternatives in which the present invention may be used, including application of comparable principles to inverted and/or bottom emitting structures.

An aspect of the invention, therefore, is a light-emitting layer structure that maximizes constructive interference for light emission by adjusting charge carrier mobilities of different sub-pixel emissive layers such that charge recombination occurs at a boundary of each emissive layer and one of the charge transport layers. In exemplary embodiments, the light-emitting layer structure includes a substrate; a first electrode layer deposited on the substrate that generates first charges; a first charge transport layer deposited on the first electrode layer that transports the first charges; a plurality of emissive layers (EMLs) deposited on the first charge transport layer including at least a first EML and a second EML; a second charge transport layer deposited on the first EML and the second EML that transports the second charges; and a second electrode layer deposited on the second charge transport layer that generates the second charges that are transported by the second charge transport layer. The first and second charge transport layers and the first EML are configured so the first EML emits light by recombination of the first and second charges at a first boundary layer formed by one of the first or second charge transport layers and the first EML, and the first and second charge transport layers and the second EML are configured so the second EML emits light by a recombination of the first and second charges at a second boundary layer formed by the second EML and one of the first or second charge transport layers. The light-emitting layer structure may include one or more of the following features, either individually or in combination.

In an exemplary embodiment of the light-emitting layer structure, the first EML has a first charge mobility favoring the first charges and the second EML has a second charge mobility favoring the second charges.

In an exemplary embodiment of the light-emitting layer structure, the first EML has a first thickness and the second EML has a second thickness different from the first thickness, depending upon a wavelength of light to be emitted from each of the first and second EMLs.

In an exemplary embodiment of the light-emitting layer structure, the first boundary layer corresponds to a standing wave maximum of a wavelength of light emitted by the first EML, and the second boundary layer corresponds to a standing wave maximum of a wavelength of light emitted by the second EML.

In an exemplary embodiment of the light-emitting layer structure, the first boundary layer corresponds to a second order mode or a third order mode of a wavelength of light emitted by the first EML.

In an exemplary embodiment of the light-emitting layer structure, the second boundary layer corresponds to a second order mode or a third order mode of a wavelength of light emitted by the second EML.

In an exemplary embodiment of the light-emitting layer structure, the structure further includes a third EML deposited between the first charge transport layer and the second charge transport layer, and having a third charge mobility favoring either the first or second charges, wherein the third EML is configured to emit light at a third boundary layer formed by the third EML and one of the first or second charge transport layers.

In an exemplary embodiment of the light-emitting layer structure, the third EML has a third thickness, depending upon a wavelength of light to be emitted from the third EML.

In an exemplary embodiment of the light-emitting layer structure, the third thickness is equal to one of the first thickness or the second thickness.

In an exemplary embodiment of the light-emitting layer structure, the third charge mobility is equal to one of the first charge mobility or the second charge mobility.

In an exemplary embodiment of the light-emitting layer structure, the third boundary layer corresponds to a second order mode or a third order mode of a wavelength of light emitted by the third EML.

In an exemplary embodiment of the light-emitting layer structure, the first, second, and third EMLs respectively correspond to EMLs that emit red, green, and blue wavelengths of light to form a white light-emitting structure.

In an exemplary embodiment of the light-emitting layer structure, the second charge transport layer comprises zinc oxide and the first charge transport layer is a hole transport layer comprising a first sub-layer formed on the first electrode layer, and a second sub-layer formed on the first sub-layer.

In an exemplary embodiment of the light-emitting layer structure, the first charge mobility has a greater electron mobility than hole mobility to promote recombination at an EML boundary with a charge transport layer having a higher hole mobility.

In an exemplary embodiment of the light-emitting layer structure, the first charge mobility has a greater hole mobility than electron mobility to promote recombination at an EML boundary with a charge transport layer having a higher electron mobility.

In an exemplary embodiment of the light-emitting layer structure, the second charge mobility has a greater electron mobility than hole mobility to promote recombination at an EML boundary with a charge transport layer having a higher hole mobility.

In an exemplary embodiment of the light-emitting layer structure, the second charge mobility has a greater hole mobility than electron mobility to promote recombination at an EML boundary with a charge transport layer having a higher electron mobility.

In an exemplary embodiment of the light-emitting layer structure, the light-emitting layer structure includes a substrate; a first electrode layer deposited on the substrate that generates first charges; a first charge transport layer deposited on the first electrode layer that transports the first charges from the first electrode layer; an emissive layer (EML) deposited on the first charge transport layer; a second charge transport layer deposited on the EML that transports second charges; and a second electrode layer deposited on the second charge transport layer that generates second charges that are transported by the second charge transport layer. The first and second charges are transported into the EML, and the EML is configured to emit light by recombination of first and second charges at a boundary layer formed by the EML and one of the charge transport layers.

In an exemplary embodiment of the light-emitting layer structure, the EML has a carrier mobility that favors the first charges, and the recombination of the first and second charges occurs at a boundary layer formed between the EML and the second charge transport layer.

In an exemplary embodiment of the light-emitting layer structure, the EML has a carrier mobility that favors the second charges, and the recombination of the first and second charges occurs at a boundary layer formed between the EML and the first charge transport layer.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to a layer structure used for light emitting devices, in particular, for QLED displays. Hardware manufactured using this disclosure may be useful in a variety of fields that use QLED displays including gaming, entertainment, task support, medical, industrial design, navigation, transport, translation, education, and training.

REFERENCE SIGNS LIST

1—light
2—top electrode
3—xyz-coordinate system
4—substrate
6—bottom electrode
8—hole transport layer (HTL)
8B—blue HTL
8a—sub-layer
8b—second HTL sub-layer
8G—green HTL
8R—red HTL
10—top emitting (TE) light-emitting device structure
12—EML
12B—blue EML
12G—green EML
12R—red EML
14—electron transport layer (ETL)
14B—blue ETL
14G—green ETL
14R—red ETL
20—bottom emitting (BE) light-emitting device structure
22—bottom electrode
24—transparent substrate
26—HTL
28—emissive layer (EML)
30—top emitting (TE) structure
32—top electrode
33—white display pixel
34—sub-pixel
34B—blue sub-pixel
34G—green sub-pixel
34R—red sub-pixel
35—optical cavity
35B—blue cavity thickness
35G—green cavity thickness
35R—red cavity thickness
36—electron/hole recombination
36B—blue electron-hole recombination
36G—green electron-hole recombination
36R—red electron-hole recombination
37B—blue HTL boundary
37G—green HTL boundary
37R—red HTL boundary
38—ETL boundary
39G—green thickness
39R/B—red/blue thickness
40B—blue maximum electric field density
40G—green maximum electric field density
40R—red maximum electric field density
41B—blue emission plane
41G—green emission plane
41R—red emission plane
42B—blue wave
42G—green wave
42R—red wave
43B—blue thickness
43G—green thickness
43R—red thickness
50—white display pixel
51B—blue sub-pixel
51G—green sub-pixel
51R—red sub-pixel
52B—blue ETL side
52R—red ETL side
53—HTL layer thicknesses
54—ETL thicknesses
55—electron/hole recombination
55B—blue electron-hole recombination
55G—green electron-hole recombination
55R—red electron-hole recombination
56G—green HTL side
60B—blue maximum electric field density
60G—green maximum electric field density
60R—red maximum electric field density
61B—blue emission plane
61G—green emission plane
61R—red emission plane
62B—blue wave
62G—green wave
63B—blue thickness
62R—red wave
63G—green thickness
63R—red thickness
68B—blue ETL boundary

What is claimed is:

1. A light-emitting layer structure comprising:
a substrate;
a first electrode layer deposited on the substrate that generates first charges;
a first charge transport layer deposited on the first electrode layer that transports the first charges;
a plurality of emissive layers (EMLs) deposited on the first charge transport layer including at least a first EML and a second EML;
a second charge transport layer deposited on the first EML and the second EML that transports the second charges; and
a second electrode layer deposited on the second charge transport layer that generates the second charges that are transported by the second charge transport layer;
wherein the first and second charge transport layers and the first EML are configured so the first EML emits light by recombination of the first and second charges at a first boundary layer formed by one of the first or second charge transport layers and the first EML, and the first and second charge transport layers and the second EML are configured so the second EML emits light by a recombination of the first and second charges at a second boundary layer formed by the second EML and one of the first or second charge transport layers.

2. The light-emitting layer structure of claim 1, wherein the first EML has a first charge mobility favoring the first charges and the second EML has a second charge mobility favoring the second charges.

3. The light-emitting layer structure of claim 1, wherein the first EML has a first thickness and the second EML has a second thickness different from the first thickness, depending upon a wavelength of light to be emitted from each of the first and second EMLs.

4. The light-emitting layer structure of claim 1, wherein the first boundary layer corresponds to a standing wave maximum of a wavelength of light emitted by the first EML, and the second boundary layer corresponds to a standing wave maximum of a wavelength of light emitted by the second EML.

5. The light-emitting layer structure of claim 1, wherein the first boundary layer corresponds to a second order mode or a third order mode of a wavelength of light emitted by the first EML.

6. The light-emitting layer structure of claim 1, wherein the second boundary layer corresponds to a second order mode or a third order mode of a wavelength of light emitted by the second EML.

7. The light-emitting layer structure of claim 1, further comprising a third EML deposited between the first charge transport layer and the second charge transport layer, and having a third charge mobility favoring either the first or second charges, wherein the third EML is configured to emit light at a third boundary layer formed by the third EML and one of the first or second charge transport layers.

8. The light-emitting layer structure of claim 7, wherein the third EML has a third thickness, depending upon a wavelength of light to be emitted from the third EML.

9. The light-emitting layer structure of claim 8, wherein the third thickness is equal to one of the first thickness or the second thickness.

10. The light-emitting layer structure of claim 7, wherein the third charge mobility is equal to one of the first charge mobility or the second charge mobility.

11. The light-emitting layer structure of claim 7, wherein the third boundary layer corresponds to a second order mode or a third order mode of a wavelength of light emitted by the third EML.

12. The light-emitting structure of claim 7, wherein the first, second, and third EMLs respectively correspond to EMLs that emit red, green, and blue wavelengths of light to form a white light-emitting structure.

13. The light-emitting layer structure of claim 1, wherein the second charge transport layer comprises zinc oxide and the first charge transport layer is a hole transport layer comprising:
a first sub-layer formed on the first electrode layer; and
a second sub-layer formed on the first sub-layer.

14. The light-emitting layer structure of claim 2, wherein the first charge mobility has a greater electron mobility than hole mobility to promote recombination at an EML boundary with a charge transport layer having a higher hole mobility.

15. The light-emitting layer structure of claim 2, wherein the first charge mobility has a greater hole mobility than electron mobility to promote recombination at an EML boundary with a charge transport layer having a higher electron mobility.

16. The light-emitting layer structure of claim 2, wherein the second charge mobility has a greater electron mobility than hole mobility to promote recombination at an EML boundary with a charge transport layer having a higher hole mobility.

17. The light-emitting layer structure of claim 2, wherein the second charge mobility has a greater hole mobility than electron mobility to promote recombination at an EML boundary with a charge transport layer having a higher electron mobility.

* * * * *